United States Patent [15] 3,700,788

Spurck [45] Oct. 24, 1972

[54] ELECTRICAL COMPONENT PACKAGE

[72] Inventor: Richard F. Spurck, Golden, Colo.

[73] Assignee: Coars Porcelain Company, Golden, Colo.

[22] Filed: Jan. 28, 1971

[21] Appl. No.: 110,693

[52] U.S. Cl. .......174/52 S, 174/DIG. 3, 317/101 CC, 317/101 CP, 317/234 G, 339/17 CF, 339/176 M

[51] Int. Cl. ............................................H05k 5/00

[58] Field of Search ...174/52 S, 52 PE, DIG. 3, 50.6, 174/50.64; 317/101 A, 101 CC, 101 CM, 101 CP, 234 G, 234 H; 339/17 CF, 176 M

[56] References Cited

UNITED STATES PATENTS

| | | | |
|---|---|---|---|
| 3,349,481 | 10/1967 | Karp | 317/101 A UX |
| 3,521,128 | 7/1970 | Oates | 317/101 A |
| 3,577,037 | 5/1971 | DiPietro et al | 317/101 A |

FOREIGN PATENTS OR APPLICATIONS

| | | | |
|---|---|---|---|
| 253,951 | 8/1964 | Australia | 174/DIG. 3 |

*Primary Examiner*—Darrell L. Clay
*Attorney*—McGlynn, Reising, Milton & Ethington

[57] ABSTRACT

A package for electrical components comprising a carrier for encapsulating the component and a socket for receiving the carrier. The carrier is in the form of a leadless circular flatpack. The socket is an annular receptacle dimensioned for accepting the carrier therein and includes a plurality of electrical connectors which engage deposited conductive patterns on the flatpack carrier to complete electrical circuit connections.

12 Claims, 5 Drawing Figures

PATENTED OCT 24 1972

3,700,788

INVENTOR.

Richard F. Spurck

BY

Barnard, McGlynn & Reising

ATTORNEYS

ELECTRICAL COMPONENT PACKAGE

This invention relates to electrical component packages.

There is presently in wide-spread use an electrical component package comprising an insulative substrate having a deposited conductor pattern and a series of thin leads brazed to the conductor pattern. The leads are typically framed prior to use. The substrate is typically a ceramic material and the deposited conductor pattern is a metalizing paste which is usually screened on and later plated. Such packages are commonly known as "flatpacks" due to their generally thin, flat and usually four-sided configuration.

As indicated above, the fabrication of the conventional flatpack requires the bonding of a lead frame to the deposited conductor pattern on the substrate surface. The frame typically comprises a substantial number of individual leads each of which must be bonded, such as by brazing, to the substrate pattern in a precise fashion. The braze bond between the leads and the conductive pattern should be rugged and reliable so as to hold up under a certain amount of lead bending and ordinary handling in use. Ordinarily the size of the flatpack and the number in which such flatpacks are typically produced makes the realization of this rugged and reliable bond quite difficult to achieve.

According to the present invention, an electrical component package requiring no lead brazing is provided. In general, this is accomplished by the combination of: (1) a leadless carrier body for the component having only a deposited conductor patterns thereon; and, (2) a socket for receiving the carrier body and having electrical connectors for completing the circuit connections from the deposited conductor paths of the carrier to a point external to the socket.

In the preferred form, the carrier and socket are generally circular in configuration and the deposited conductive path pattern on the carrier is substantially, if not perfectly radial in character. This configuration requires far less substrate material and space than the conventional four-sided flatpack and, in addition, shortens the deposited conductive paths, thus, minimizing interpath capacitance.

In the illustrative form described hereinafter, the carrier body is a laminated multilayer device of dense ceramic material having uniformly-spaced uniplanar deposited conductors on an intermediate surface layer. The socket is essentially annular and receives the carrier therein with the deposited conductors faced down, i.e., toward the bottom of the socket. Connectors having resilient terminal ends within the socket meet and engage the deposited conductors as the carrier is latched in place. These connectors extend through the socket base to facilitate the making of connections to a circuit board or other external apparatus.

The various features and advantages of the invention will become more apparent by reading the following specification which sets forth in detail an illustrative embodiment of the invention. This specification is to be taken with the accompanying drawings of which:

Figures 1, 2, 3, 4:
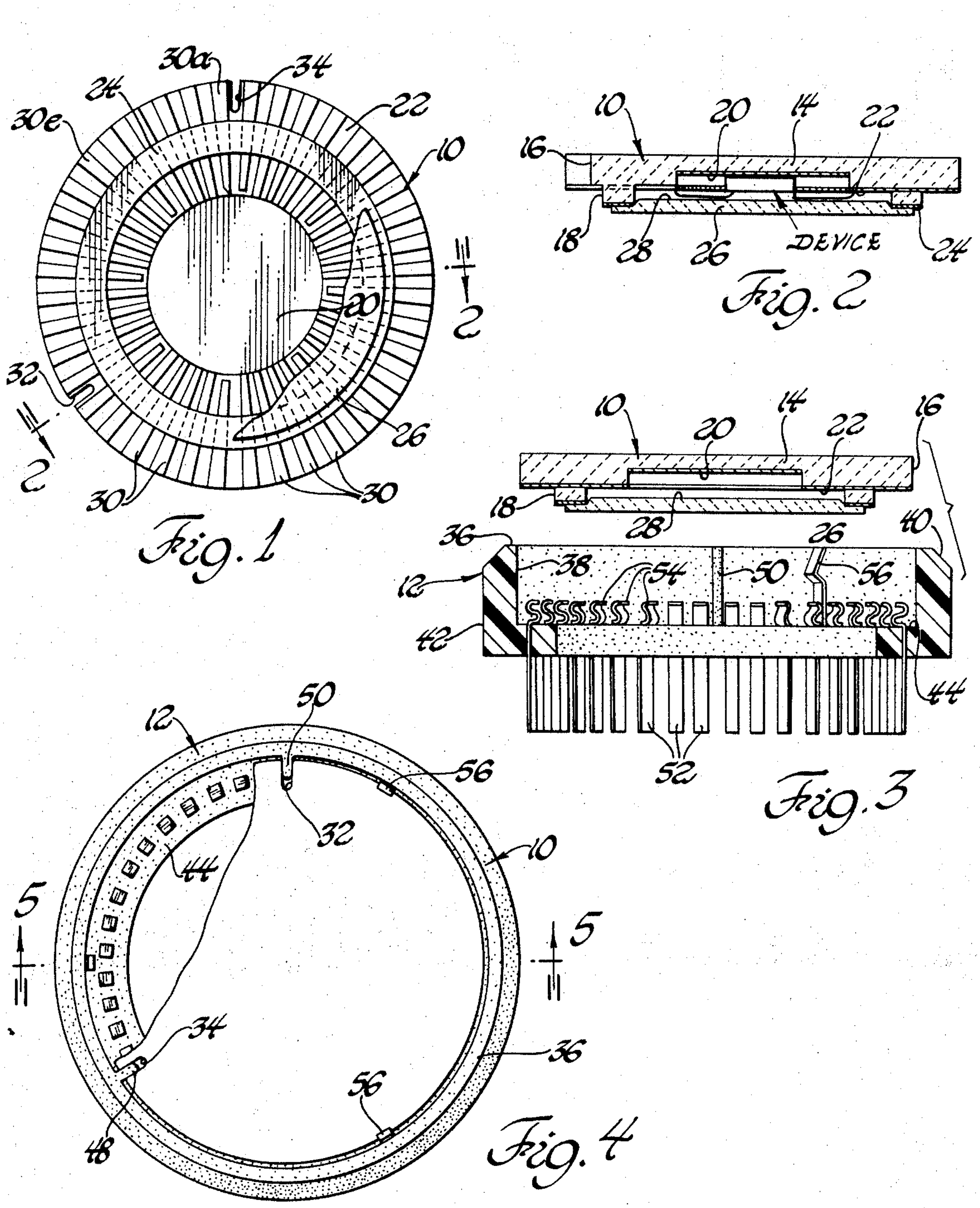
FIG. 1 is a plan view of a carrier of circular configuration.
FIG. 2 is a sectional view of the carrier of FIG. 1.
FIG. 3 is a combination view of a carrier and a socket, indicating the manner in which they are placed together.
FIG. 4 is a plan view of the combined carrier and socket, with parts broken away; and, FIG. 5 is a sectional view of the combination of FIG. 4.

Referring now to the drawings, the package for electrical components illustrated therein comprises a carrier body 10 which is generally of a disc-like configuration, i.e., circular and flat, and which is designed to receive and support an electrical component such as a semiconductor integrated circuit. The carrier body 10, as is hereinafter described in detail, further provides partial electrical connections between the integrated circuit device and the outside world.

The package further comprises a socket 12 which is of generally annular configuration and which is adapted to receive and support therein the carrier 10. In addition, the socket 12 serves to complete the electrical connections between the integrated circuit device and the outside world. As will be readily appreciated by those skilled in the art, the term "outside world" in the sense used herein means an external circuit board or other suitable facility which completes the interconnection of the integrated circuit or other component carried by the subject package and such additional electrical apparatus as is required to constitute any given electrical system.

Referring specifically to FIGS. 2 and 3, the carrier 10 is shown to comprise laminated layers 14, 16, and 18 of which layer 14 is a circle, layer 16 is a ring of external diameter equal to that of the layer 14, and layer 18 is a ring of smaller radial dimension and of lesser external diameter than the layer 16. The laminated layers 14, 16, and 18, which combine to form a substantially monolithic structure in the finished product 10, define an internal stair step configuration comprising a base surface or floor 20 for the support of the electrical component or device to be housed by the carrier 10, an intermediate surface 22 which carries the deposited conductor pattern as hereinafter described, and the top surface 24 which is adapted to receive a circular cover 26. The floor 20 is metalized and plated with a conductive metal, such as gold, to facilitate brazing of the circuit component. The top surface 24 is also metalized and plated to facilitate a braze bond to the cover 26. Cover 26 is provided with a peripherally chamferred lamination 28 which fits within the internal diameter of the ring layer 18 for location purposes. The braze bond between the cover 26 and the top surface 24 of the carrier 10 is preferably of such quality as to effect an hermetic seal to encapsulate the electrical circuit component.

Figure 5:
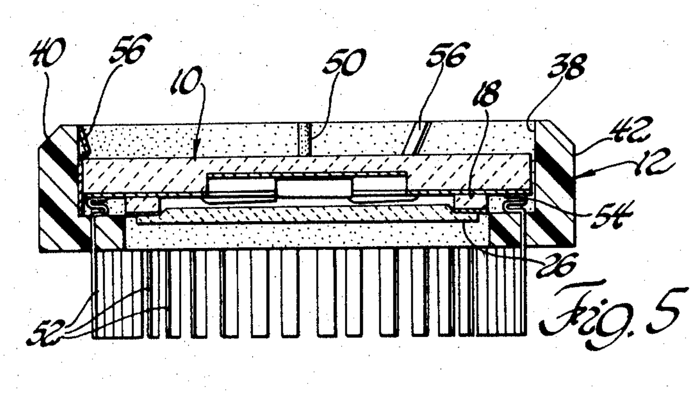

As best shown in FIG. 1, the intermediate surface 22 has deposited thereon a pattern of radially extending and uniformly angularly spaced conductive paths 30 which extend from a point substantially coextensive with the inner diameter of the ring 16 to the outer diameter of the carrier 10 and, thus, extend fully beneath the top ring 18 as shown in FIG. 5. This is accomplished, as hereinafter described in greater detail, by depositing the conductive paths 30 prior to placing the top ring 18 in position.

The conductive paths 30 include a first path **30*a* which is geometrically distinct from the other paths solely for identification purposes. The geometrical distinction of path 30*a*** is accomplished by chamferring the inner end thereof as shown. Thereafter, every fifth lead, such as 30*e*, is truncated at the inner end, again, solely for identification purposes. This identifies the individual conductive paths and the connections between such paths and the integrated circuit device on the floor 20.

Operating in conjunction with this lead path identification scheme is a pair of radial notches 32 and 34 which cooperate with corresponding locator protrusions 48, 50 in the socket 12 to limit the angular orientation between the carrier 12 and the socket 12 to a given orientation and to prevent inadvertent insertion of the carrier 10 in any other orientation.

The carrier 10 is preferably made of a dense metal oxide base ceramic material such as alumina. To fabricate the carrier 10, a slip of the ground ceramic in a plasticizer and binder matrix is cast into tape form and the various parts which make up the carrier 10 are punched from this tape while in the green or unsintered state. The conductive surfaces on the three layers 14, 16, and 18 are screened on by forcing a molybdenum-manganese or tungsten composition paste through a screen or other pattern laying device. This metalization is performed while the ceramic parts are in the green state. The parts 14, 16, and 18 are then placed on top of one another in the desired configuration and laminated under pressure, preferably isostatically applied, to produce a weak bond between the green ceramic layers. The laminated structure is then fired in a reducing atmosphere at approximately 1,600°C to burn out the binder and plasticizer and to bond the ceramic material together by the well known sinterring process. This process actually obliterates the boundaries between the laminations and results in a substantially monolithic multilayer structure as shown. The part may thereafter immersed in a plating bath to coat the metalized areas with a durable conductive material such as gold, silver, or nickel.

It is to be understood that the geometry of the carrier 10 shown in the drawings is exemplary in nature and that various changes in this geometry can be made. For example, the floor 20 may be square or rectangular in configuration to conform to the device which is to be installed therein. Moreover, the entire structure of the carrier 10 may be square, rectangular, or of such other geometry as suits the particular application thereof. The circular or round geometry has various advantages over the square or rectangular geometry more often used such as the lesser sensitivity to firing shrinkage in the ceramic. Other advantages are described herein. The internal geometry of the socket 12 will, of course, be similarly varied to accommodate the carrier 10 but again, the annular geometry is preferred.

When the carrier is ready for receipt of the circuit device or component, the device is bonded by brazing to the plated floor 20. Thereafter, individual whisker leads are interconnected by means of a well known wire bonding technique between the various components of the circuit and the individual plated conductive paths 30 on the interior side of the ring 18. The individual radial paths 30, thus, serve to extend these connections to the outside of the ring 18, i.e., to the spaced conductive paths about the surface 22. It will be observed that the equal and uniform spacing between the individual paths 30 permits the wire bonding to be easily carried out with an indexing tool which simply rotates the desired number of degrees between bonding operations. In addition, the relatively short paths 30 give rise to decreased resistance and increased circuit speed.

Referring now to FIGS. 3, 4, and 5 the socket 12 will be described in greater detail. As previously mentioned, socket 12 is of generally annular configuration and is made of a dielectric material, such as a ceramic or a plastic or other synthetic material such as polyethylene or nylon. Socket 12 is constructed to have an upper annular lip 36 which terminates at the interior dimension in an interior wall 38 and which terminates at the outer diameter at a chamfer 40 which is contiguous with an external wall 42. The internal wall 38 extends to an annular floor 44 which may be solid across the base of the socket or which may be provided with a central opening as necessary. Axial protrusions 48 and 50 are formed on the wall 38 at a spacing which corresponds to the spacing between the notches 32 and 34 in the carrier 10. These protrusions 48 and 50, thus, limit the entry of the carrier 10 into the socket 12 to one predetermined angular orientation.

A plurality of copper alloy electrical connectors 52 are disposed in the socket 12 by molding or insertion through suitable apertures to provide a high-friction fit. The electrical connectors 52 have the internal terminal ends 54 bent into an axially resilient S-shaped configuration and spaced at regular intervals around the floor 44 so as to correspond in spacing and radial location with the portions of the deposited conductive paths 30 on the carrier 10 which lie radially outward of the ring layer 18. Therefore, each of these deposited conductor patterns engages a resilient terminal end 54 of a connector 52 when the carrier 10 is inserted face down in the socket 12 with the notches 32 and 34 in register with the protrusions 50 and 48, respectively. Three springs 56 are provided on the interior wall 38 to provide a snap fit between the carrier 10 and the socket 12. The external ends of the connectors 50 extend axially from the bottom surface of the socket 12 in a parallel and circularly arrayed pattern.

In operation an electrical circuit device or component is packaged in the leadless carrier 10 by brazing and wire binding as previously described. The carrier 10 is then inserted face down into the socket 12 such that the deposited conductive paths engage the resilient terminal ends 54 of the connectors 52. This automatically completes all or selected electrical circuits between the encapsulated electrical device and the connectors 52. The connectors 52 may be readily inserted in or bonded to a circuit board or other external device to render the encapsulated circuit device operative with respect to the rest of a given system.

It is to be understood that the foregoing description is illustrative in character and is not to be construed in a limiting sense. Many changes can be made to the illustrated structure as, for example, the use of multilayer circuitry and vertical connectors or "vias" in the carrier body 10. In addition, other conductive path patterns may be used, with more or fewer paths 30. Further, heat sinks may be incorporated. Other changes and additions will occur to those skilled in the art.

The embodiments of the invention in which an exclusive property or privilege is claimed are defined as follows:

1. A packaged electrical component comprising: a leadless carrier body of passive dielectric material, said body comprising a stacked plurality of laminations defining a base layer, a contact layer and a top layer, said layers lying in respective axially-spaced planes, the base layer having a central area on which the electrical component is mounted, the contact layer having deposited thereon a pattern of outwardly extending, discrete conductive paths extending continuously and in the same plane from adjacent said central area to a peripheral point outside of said top layer, conductor means connected between the component and at least some of the conductive paths, and a socket of dielectric material operatively receiving the carrier body in supported relation therewith, said socket having an interior volume receiving the carrier substantially totally therewithin, the socket including discrete, metallic electrical connectors having first terminal ends within said interior volume and arranged in a pattern corresponding at least in part to the pattern of conductive paths on said carrier body, said carrier being disposed in the interior volume of the socket establishing electrical contact between the conductive paths of said carrier and the connectors of said socket, the connectors having second terminal ends extending externally from the socket for external connection thereof.

2. A package as defined in claim 1 wherein the carrier body is constructed of a fired, metal oxide base ceramic.

3. A package as defined in claim 2 wherein the carrier body is substantially flat, the area for said component being disposed substantially centrally thereof, and the deposited conductive paths extending substantially radially therefrom.

4. A package as defined in claim 3 wherein the body is substantially circular.

5. A package as defined in claim 4 wherein the pattern of deposited conductive paths is radial, the first terminal ends of the connectors in said socket being arranged in a circular pattern.

6. A package as defined in claim 5 including means for limiting operative receipt of the carrier body by the socket to a predetermined angular orientation therebetween, said orientation being such as to match said deposited conductive paths to said first terminal ends.

7. A package as defined in claim 1 wherein the carrier body is a laminated, multilayer body of dense ceramic material.

8. A package as defined in claim 1 wherein the paths are radially oriented and uniformly angularly spaced apart.

9. A package as defined in claim 8 wherein one of the paths is geometrically unique for identification purposes.

10. A package as defined in claim 1 wherein said first terminal ends are coplanarly arranged within the receptacle.

11. A package as defined in claim 10 including means on the socket for securing the carrier body in the receptacle.

12. A package as defined in claim 1 including resilient means carried by the socket for providing a removable snap-fit securement of the carrier within the interior volume of the socket.

* * * * *